TUNER DISENGAGEMENT MECHANISM

Filed June 7, 1957 2 Sheets-Sheet 1

INVENTOR.
Louis A. Bevacqua,
BY Mueller & Aichele
Att'ys.

TUNER DISENGAGEMENT MECHANISM

Filed June 7, 1957

INVENTOR.

Louis A. Bevacqua,

BY Mueller & Aichele

Att'ys

United States Patent Office 2,967,431
Patented Jan. 10, 1961

2,967,431

TUNER DISENGAGEMENT MECHANISM

Louis A. Bevacqua, Des Plaines, Ill., assignor to Motorola, Inc., Chicago, Ill., a corporation of Illinois Filed June 7, 1957, Ser. No. 664,346

9 Claims. (Cl. 74—10.27)

This invention relates to tuning devices for radios or the like and more particularly to tuning devices incorporating push-button and manual knob tuning.

In general, tuning devices incorporating push-button and manual dialing tuning involves the use of a treadle mechanism for controlling one or more tuning elements. Since the treadle mechanism must be capable of actuation by either the push-button mechanism or the manually operated knob, both actuating mechanisms are connected to one another through the treadle. This has caused certain difficulties since movement of the treadle by the push-button necessarily serves to drive the gear train connected to the tuning knob. Because of the rather large gear ratio usually involved, a very substantial load must be overcome when the treadle is coupled to the tuning knob through the gear train and the treadle is moved by means of the push-buttons. Thus, an inconveniently large force would be required to operate the push-button mechanism. In order to avoid this difficulty, it has been the practice to provide means for disengaging the gear train of the manual control knob from the treadle assembly when tuning by means of the push-buttons. This has involved the incorporation of clutch disc, declutch bars, springs and other parts into the tuning mechanism and adds to the cost and difficulty of its assembly.

It is an object of the present invention to provide a tuning device operable by either push-button or manual knob control wherein the knob control gear train may be rendered inoperative when the push-button controls are employed without the necessity of employing elaborate declutching devices.

It is another object of the invention to provide a tuning mechanism in which push-button controls can be operated easily by application of a relatively small pressure.

Yet another object of the present invention is to provide a simple tuning device which is relatively inexpensive and easy to assemble while permitting easy operation of the push-button tuning means.

It is still another object of the invention to provide a tuning mechanism especially adapted for use in push-button controls which will serve as an effective brake to prevent creeping due to vibration of the treadle mechanism controlling the tuning elements.

A feature of the present invention is the provision of a frictionally mounted gear in a dual control tuning device which transmits power only when one of the tuning control means is actuated.

Another feature is the provision of a gear mounted on a shaft and held against rotation with respect to the shaft by a predetermined amount of frictional force so that it will transmit rotary motion to the shaft to actuate tuning elements when a force less than the holding friction is applied to turn the gear by operation of one of two control means.

Yet another feature of the invention is a tuning device operated by either knob or push-button controls in which the force required to rotate the knob by applying force to the gear train connecting it with the tuning means is substantially greater than the force required to operate the tuning means itself. By providing a gear carried on a shaft and held against rotation with respect to the shaft by a frictional force greater than that required to operate the tuning means but less than that required to turn the knob from the gear train, the tuning means can be operated by turning the knob manually but the frictionally held gear is locked against the gear train of the knob when the push-button controls are operated. The shaft on which the gear is mounted then rotates freely with respect to the gear and is effectively disconnected from the knob gear train as are the push-button controls and the tuning means.

For a complete understanding of the invention reference may be had to the accompanying drawings in which.

The present invention includes a tuning device useful in connection with a radio or the like having two independently operable tuning means for actuating a tuning element such as a coil. The mechanism includes an assembly operatively connected to the tuning elements and capable of being actuated by either of the two tuning means. A driven gear frictionally mounted on a shaft is connected to this assembly. A connecting gear engages the driven gear and itself is actuated by one of the tuning means. A spring washer applies a predetermined amount of friction tending to hold the driven gear against rotation with respect to the shaft upon which it is mounted so that the driven gear will transmit motion to the shaft when a force less than the frictional force is applied. This frictional force is greater than that required to actuate the tuning element but less than the force required to turn the connecting gear by means of the driven gear when the driven gear is actuated by one of the tuning means. Thus, there is relative rotation between the driven gear and the shaft when this tuning means is actuated while the driven gear serves to transmit power to the shaft to actuate the tuning element when the other tuning means is employed. Where the tuning means employed are a manually operated knob and a series of push-buttons, the holding pressure applied to the driven gear is adjusted so that relative slippage between the driven gear and the shaft carrying it occurs when push-buttons are employed and the treadle mechanism will not have to work against the resistance of the knob through its gear train.

Figures 1, 2, 3:
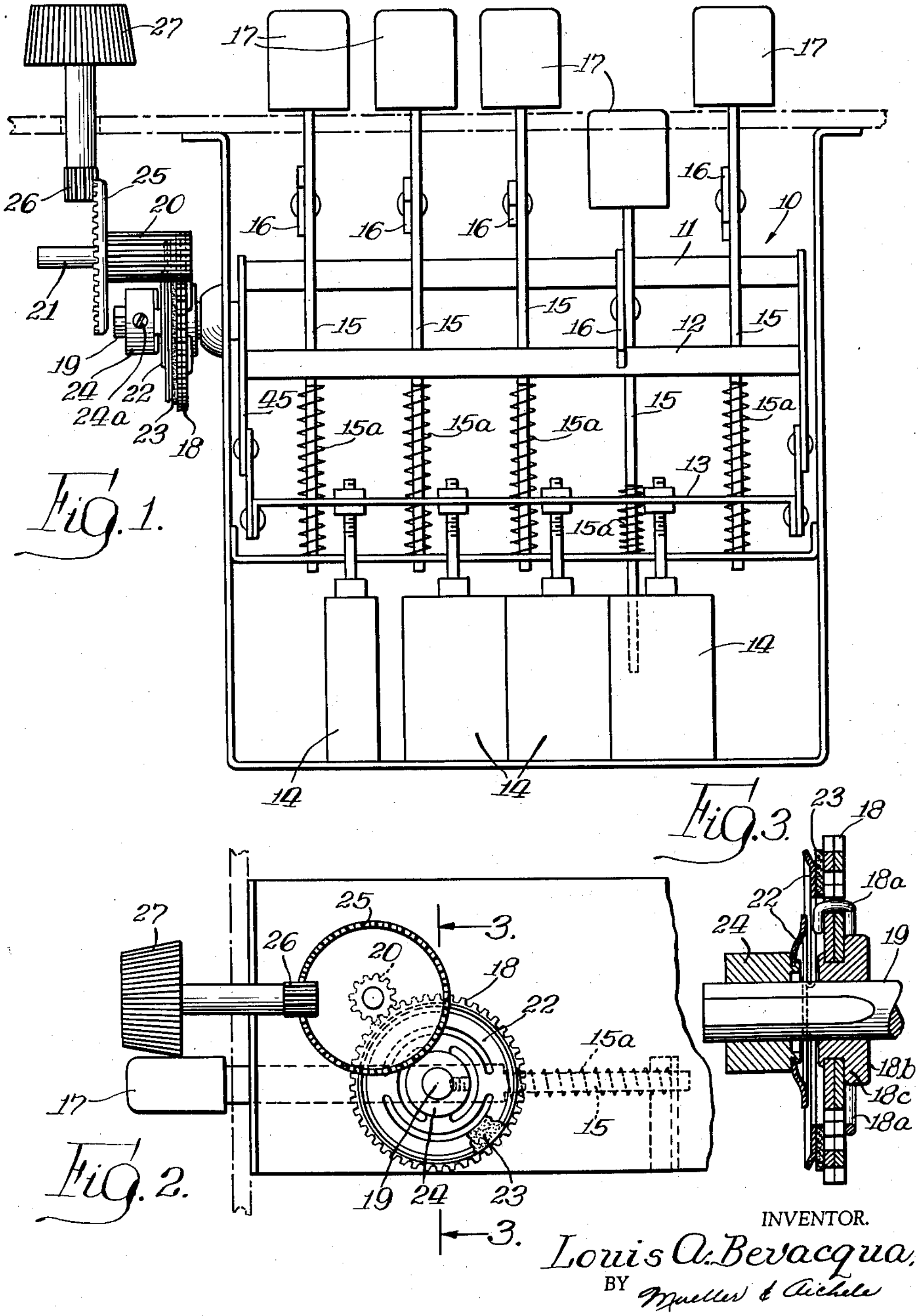
Fig. 1 is a view in top elevation of a tuning mechanism operating either by push-button controls or by manual dial controls and showing a plurality of tuning elements connected to and actuated by a treadle assembly.
Fig. 2 is a fragmentary view in side elevation of the embodiment of the invention shown in Fig. 1 more clearly showing the gearing arrangement.
Fig. 3 is a view in section taken on the line 3—3 of Fig. 2.

Turning now to the drawings and particularly to Fig. 1, there is shown generally at 10 a treadle assembly consisting of cross-bars 11 and 12 with a core carriage 13 carried thereon. Rotation of the treadle assembly 10 causes movement of the core carriage 13 which is operatively connected to the tuning elements such as the tuning coils indicated generally at 14.

Push-button arms 15 carry adjustable cams 16 for contacting the cross-bars 11 or 12 when push-button arms 15 are moved toward the treadle assembly by actuation of the push-buttons 17. Each push-button arm 15 works against a corresponding return spring 15a which causes it to return to its original position after actuating treadle assembly 10.

As shown particularly in Fig. 3, a pair of driven gears 18 connected by wire clip 18a are carried on shaft 19 by means of bushing 18b. The gears 18 are held against rotation with respect to shaft 19 by the pressure of flexible metal spring washer 22 urging flat rubber washer 23 against the flat surface of the adjacent gear and also urging the gears against shoulder 18c of bushing 18b. Spring washer 22 is staked to bushing 24 which is held to shaft 19 by set screw 24c.

Driven gear 18 engages connecting gear 20 which is carried on stub shaft 21. The crown gear 25 is mounted at the end of stub shaft 21 and engages the tuning gear 26 which is actuated by turning the manual tuning knob 27.

When manual tuning is employed, rotation of the knob 27 transfers motion through gears 26, 25, and 20 to driven gear 18 which rotates the treadle shaft 19 and the treadle assembly 10 to actuate the tuning coils 14 through motion of the core carriage 13. The frictional force holding the washers 22 and 23 against gears 18 causes the bushing 24 (to which washer 22 is staked) to turn with gear 18. Since bushing 24 is held to treadle shaft 19 by set screw 24a, the shaft is rotated thus actuating coils 14. This is made possible by adjusting the frictional pressure provided by the washers 22 and 23 so that it is greater than the force required to actuate the tuning coils 14 and thus greater than the force transmitted from knob 27. The application of this amount of force is insufficient to overcome the friction holding driven gears 18 to treadle shaft 19 (through washers 22 and 23 and bushing 24) so that they rotate together.

When the push-button tuning mechanism is employed, depression of the push-button 17 causes adjustable cam 16 mounted on push-button arm 15 to move toward the treadle assembly 10. On contact with one of the cross-bars 11 or 12, the cam 16 rotates treadle assembly 10 which in turn actuates tuning coils 14. The turning of treadle assembly 10 causes rotation of the treadle shaft 19. If the driven gears 18 were so held to treadle shaft 19 so that relative rotation between them were impossible, depression of a push-button 17 would turn knob 27 through its gear train provided sufficient pressure were applied; otherwise the push-button tuning mechanism would be inoperative. Because of the gear ratios involved, the mass of the knob 27 is greatly magnified so that a very considerable amount of force would be required to turn the treadle assembly 10 by means of the push-buttons 17. However, in accordance with the present invention, the gears 18 are effectively locked to gear 20 because the frictional force supplied by washers 22 and 23 is less than the force required to turn gear 20 against the weight of knob 27. When shaft 19 rotates washer 23 slips over the flat surface of stationary gear 18 and the treadle shaft 19 rotates inside bushing 18c. The only force required to actuate the treadle assembly is that required to overcome the fractional force supplied by washers 22 and 23 which force is greater than that necessary to actuate coils 14 but much less than would be needed to operate the gear train against the weight of knob 27.

According to the present invention, engagement of the driven gears 18 (which is connected to the treadle assembly 10) with the connecting gear 20, provides sufficient braking action to prevent undesired movement of the core carriage 14 due to vibration which might affect accuracy of tuning.

Figures 4, 5, 6:
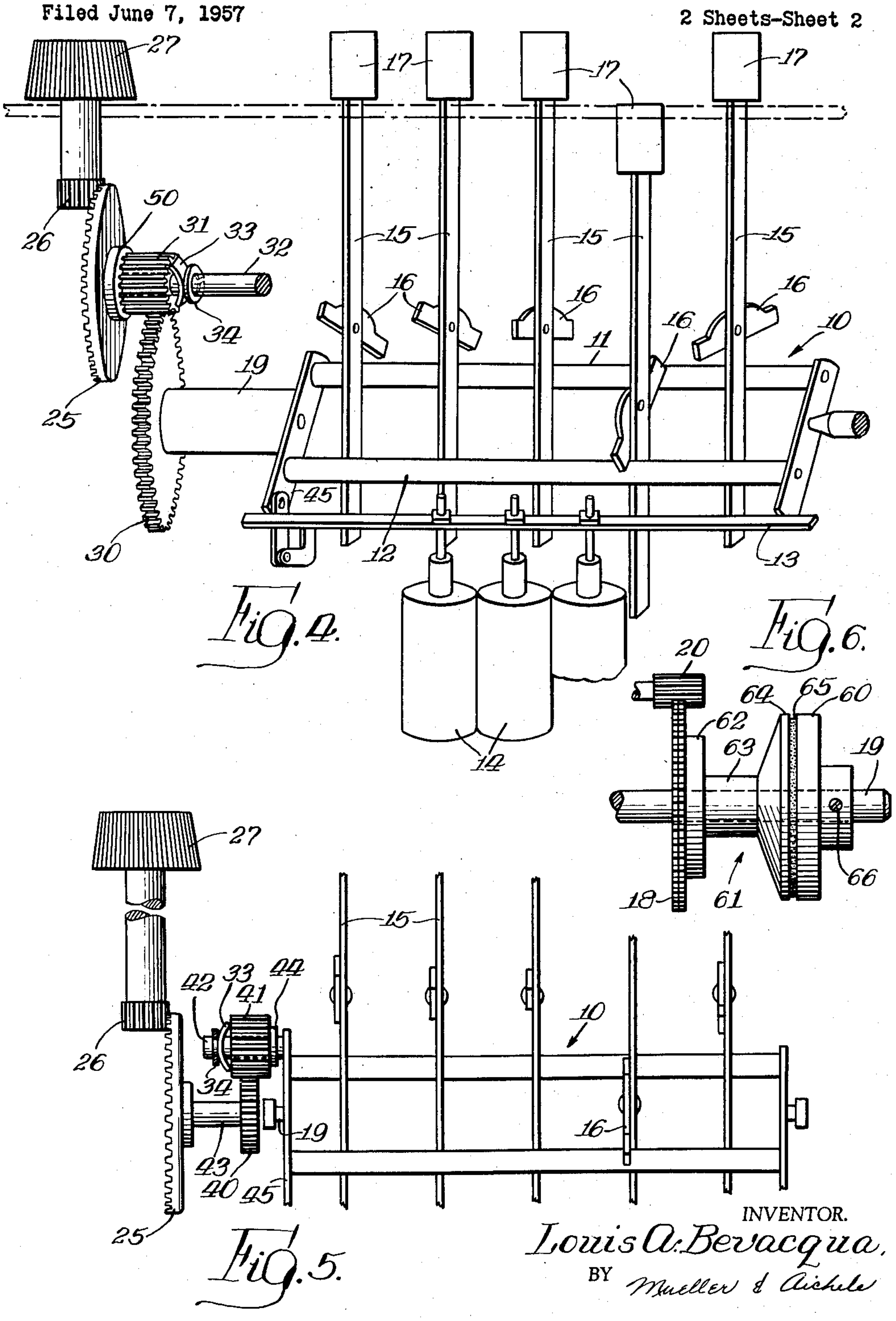
Fig. 4 is a view in top elevation of another embodiment of the invention.
Fig. 5 is a view in top elevation with the tuning coils omitted, showing different embodiment of the invention than that of Figs. 1 and 2.
Fig. 6 is a fragmentary view in section similar to Fig. 3 showing another means of applying frictional force to a gear.

Instead of applying the frictional holding force to the gears 18 by means of a flexible spring washer, a permanent magnet arrangement of the type illustrated in Fig. 6 may be used. The permanent magnet 60 is fixed to shaft 19 by set screw 66. The assembly indicated generally at 61 consisting of gears 18, shoulder 62, connecting sleeve 63 and shoulder 64 rides freely on shaft 19 with gears 18 being staked to shoulder 62. Washer 65 spaces magnet 60 from shoulder 64 which is made of metal attracted by the magnet. The magnetic pull of magnet 60 against shoulder 64 and hence against assembly 61 creates a frictional holding force tending to prevent assembly 61 (including gears 18) from rotating with respect to shaft 19. Thus, when the knob tuning means is actuated the magnetic attraction between magnet 60 and shoulder 64 sets up a frictional force through washer 65 holding assembly 61 against magnet 60 and causing it and shaft 19 to turn with gears 18. When the push-button tuning means is operated, the friction created by the magnetic attraction is less than the force necessary to turn gear 20 against the weight of knob 27 so that gears 18 and assembly 61 remain stationary while shaft 19 and magnet 60 rotate with respect to the locked assembly 61.

Another aspect of the present invention is illustrated in Fig. 4. Like that illustrated in Figs. 1 and 2, it includes a treadle assembly and capable of being operated by either the push-buttons 17 which work against return springs (not shown in Fig. 4) and by a tuning knob 27. In this embodiment, the treadle shaft 19 has mounted at its end an anti-backlash gear 30 which, in this embodiment, serves as a connecting gear. The anti-backlash gear 30 engages the driven gear 31 which is carried on stub shaft 32 and is held against shoulder 50 by means of friction applied by the spring washer 33 and the flat washer 34. When the knob 27 is turned force is transmitted through tuning gear 26 and crown gear 25 to rotate the stub shaft 32 together with the driven gear 31. This, in turn, rotates the anti-backlash gear 30 and actuates the treadle assembly 10. This is possible as the force required to actuate the tuning coils 14 is less than the frictional pressure holding the gear 31 against the shoulder 50.

When the push-button 17 is depressed, it causes rotation of treadle shaft 19 and anti-backlash gear 30. The weight of knob 27 is effective to lock crown gear 25 against gear 26 and since the force supplied by rotation of shaft 19 is greater than the frictional pressure tending to hold gear 31 against shoulder 50, the gear 31 slips and rotates with respect to stub shaft 32.

In the embodiment of the invention shown in Fig. 5, a somewhat different arrangement is employed. Here, the crown gear 25 is mounted on the shaft 43 which is coaxial with the treadle shaft 19 but separate from it. A connecting gear 40 is also carried on shaft 43 connected to the crown gear 25. The connecting gear 40 engages a driven gear 41 which is frictionally held on a stub shaft 42 by means of spring washer 33 and flat washer 34. Stub shaft 42 extends from arm 45 of the treadle assembly 10. As in the case of the other two embodiments, the frictional force supplied by these washers is greater than that required to actuate the tuning coils but less than that required to overcome the resistance of the knob 27 through its gear train. When the knob 27 is turned, thus causing rotation of the shaft 43, the driven gear 41 which is mounted directly to the treadle assembly 10 remains locked with respect to the shaft 42 and so acts as a linkage to the arm 45. Stub shaft 42 does not rotate as do the shafts upon which the driven gears are mounted in the other two embodiments but rather moves through an arc as the driven gear 41 moves around with gear 40. The shaft 42 therefore actuates treadle assembly 10 by serving as a fixed mounting stud connecting the gear 41 and the treadle assembly. In this way the rotation of the connecting gear 40 causes a corresponding direct rotation of the treadle assembly 10.

When the treadle assembly 10 is actuated by depression of push-buttons 17 and push-button arms 15, crown gear 25 is locked in position by the weight of knob 27 as is connecting gear 40. Sufficient force is transmitted to driven gear 41 to overcome the friction supplied by washers 33 and 34 which hold it against shoulder 44 but not sufficient to overcome the resistance of knob 27 through its gear train. Thus, the driven gear 41 rotates with respect to the shaft 42 and moves around the periphery of the connecting gear 40 in the manner of a planetary gear moving around a stationary sun gear without transmitting any motion to it.

The embodiments of the invention shown in Figs. 4 and 5 also provide the same beneficial braking action against undesired tuning changes due to vibration as is described in connection with the embodiments shown in Figs. 1 and 2.

It will be understood, of course, that the particular means shown for applying holding friction to the driven gear are only exemplary and that any other suitable friction applying means may also be employed. In the same way, equivalent tuning elements (such as condensers) may be substituted for the tuning coils 14.

It will be apparent from the above description therefor that the present invention provides an efficient dual control tuning mechanism in which either control means may be operated independently of the other. More particularly, it provides push-button tuning means which may be operated in a device having knob control means without the necessity of supplying an elaborate declutching mechanism for effecting disengagement between the push-button and the knob controls when the knob controls are operated, while at the same time permitting operation of the push-button control means without actuating or working against the knob control means.

What is claimed is:

1. In a tuning device having knob tuning means and push-button tuning means for actuating a tuning coil, the combination including a treadle assembly operatively connected to said tuning coil and actuated by both tuning means, a stub shaft fixedly mounted on said treadle assembly, a driven gear carried on said stub shaft, a connecting gear engaging said driven gear and actuated by said knob tuning means, and means carried at a fixed lateral position on said stub shaft bearing against said driven gear for applying a constant predetermined frictional force to said driven gear tending to prevent its rotation with respect to said stub shaft, said predetermined frictional force being less than the frictional force which must be overcome to turn said knob tuning means so that said driven gear slips on said stub shaft in response to actuation of said push-button tuning means, said predetermined force being greater than the frictional force which must be overcome to drive said treadle assembly to operate said tuning coil so that said driven gear rotates with said stub shaft in response to operation of said knob tuning means, said push-button tuning means applying a force to said treadle assembly which overcomes said predetermined frictional force between said driven gear and said force applying means, so that said driven gear rotates about said stub shaft slipping against the friction applying means and moves around the periphery of said connecting gear without imparting motion thereto when said push-button tuning means is actuated, while said driven gear is locked with respect to said stub shaft and transmits power from said connecting gear directly thereto to actuate said treadle assembly when said knob tuning means is actuated.

2. A tuning device according to claim 1 including a shoulder carried on said stub shaft adjacent said driven gear and spring washer means on said shaft adapted to urge said driven gear against said shoulder.

3. In a tuning device having first and second operating means for actuating a tuning element, the combination including, actuating means operatively connected to the tuning element and actuated by both the first and second operating means, a shaft and a driven gear carried thereon and connected to said actuating means, connecting gear means engaging said driven gear and actuated by said first operating means, means carried at a fixed lateral position on said shaft and bearing against said driven gear for applying a constant predetermined frictional force to said driven gear tending to prevent relative rotation between the same and said shaft, said predetermined force being less than the frictional force which must be overcome to turn said driven gear and said connecting gear means so that said driven gear slips on said shaft in response to operation of said second operating means, said predetermined force being greater than the frictional force which must be overcome to drive said actuating means to operate said tuning element so that said driven gear rotates on said shaft in response to operation of said first operating means, and means independent of said connecting gear means and said driven gear coupling said second operating means to said actuating means, said second operating means applying a force to said actuating means to overcome said predetermined frictional force between said driven gear and said friction applying means and thereby causing movement of said actuating means with said driven gear and said connecting gear remaining stationary, with said driven gear and said shaft cooperating to transmit power to move said actuating means when said first operating means is actuated.

4. In a tuning device having knob means and push-button means for actuating tuning means, the combination including, a treadle assembly operatively connected to the tuning means and actuated by both said knob means and said pushbutton means, a driven gear carried on a shaft and connected to said treadle assembly, a connecting gear engaging said driven gear and actuated by said knob means, and means carried at a fixed lateral position on said shaft bearing against said driven gear for applying a constant predetermined frictional force thereto tending to prevent relative rotation between said driven gear and said shaft, such predetermined frictional force being less than the frictional force which must be overcome to turn said connecting gear so that said driven gear rotates on said shaft in response to actuation of said pushbutton means, said predetermined force being greater than the frictional force which must be overcome to cause movement of said treadle assembly so that said driven gear rotates with said shaft in response to operation of said knob means, said pushbutton means causing movement of said treadle assembly by applying thereto a force sufficient to overcome said predetermined frictional force applied to said driven gear so that said driven gear rotates with respect to said shaft and said connecting gear remains stationary, with said driven gear and said shaft cooperating to transmit power to actuate said treadle assembly when said knob means is actuated.

5. The combination of claim 4 wherein said means for applying a predetermined frictional force includes a permanent magnet fixed to said shaft.

6. In a tuning device having knob tuning means and pushbutton tuning means for actuating a tuning coil, the combination including a treadle assembly operatively connected to said tuning coil and actuated by both tuning means and coupling the same together, said treadle assembly having a treadle shaft, a driven gear carried on said treadle shaft, a driving gear engaging said driven gear and actuated by said knob tuning means, and means carried at a fixed lateral position on said shaft bearing against said driven gear for applying a constant predetermined frictional force to said driven gear tending to prevent relative rotation between said driven gear and said shaft, such predetermined frictional force being less than the frictional force which must be overcome to turn said driving gear so that said driving gear slips with respect to said shaft in response to movement of said treadle assembly resulting from actuation of said pushbutton tuning means, said predetermined force being greater than the frictional force which must be overcome to move said treadle assembly to operate said tuning coil so that said driven gear rotates with said shaft in response to operation of said knob tuning means, said pushbutton tuning means applying a force to said treadle assembly overcoming said predetermined frictional force applied to said driven gear to move said treadle assembly, with slippage taking place between said driven gear and the friction applying means to cause relative rotation between said driven gear and said shaft so that said driving gear remains stationary, while said driven gear and said shaft cooperate to transmit power to actuate said treadle assembly when said knob tuning means is actuated.

7. A tuning device according to claim 6 including shoulder means carried on said treadle shaft adjacent said driven gear, and spring washer means on said shaft adapted to urge said driven gear against said shoulder means.

8. In a tuning device having knob tuning means and pushbutton tuning means for actuating a tuning coil, the combination including, a treadle assembly operatively connected to said tuning coil and actuated by both said tuning means, said treadle assembly including a treadle shaft, a connecting gear carried on said treadle shaft, a driven gear mounted on a stub shaft and engaging said connecting gear, said stub shaft being coupled to and actuated by said knob tuning means, and means carried at a fixed lateral position on said stub shaft bearing against said driven gear for applying a constant predetermined frictional force to said driven gear tending to prevent rotation of said driven gear with respect to said stub shaft, such predetermined frictional force being less than the frictional force which must be overcome to turn said connecting gear against the friction of said knob tuning means so that said driven gear rotates with respect to said stub shaft in response to actuation of said pushbutton tuning means, said predetermined force being greater than the frictional force which must be overcome to drive said treadle assembly to operate said tuning coil so that said driven gear rotates with said stub shaft in response to operation of said knob tuning means, said pushbutton means applying to said treadle assembly a force overcoming said predetermined frictional force applied to said driven gear for rotating said treadle shaft, with said driven gear slipping against said friction applying means and rotating around said stub shaft, while said driven gear and said stub shaft rotate together to drive said connecting gear and actuate said treadle shaft, treadle assembly and tuning coil when said knob tuning means is actuated.

9. A tuning device according to claim 8 including shoulder means carried on said stub shaft adjacent said driven gear and spring washer means on said shaft adapted to urge said driven gear against said shoulder means.

References Cited in the file of this patent

UNITED STATES PATENTS

| | | |
|---|---|---|
| 2,147,204 | Laird | Feb. 14, 1939 |
| 2,267,474 | McGarvey | Dec. 23, 1941 |
| 2,436,418 | Bradford | Feb. 24, 1948 |
| 2,770,137 | Sacre | Nov. 13, 1956 |
| 2,811,045 | Thompson | Oct. 29, 1957 |